(12) United States Patent
Saito

(10) Patent No.: US 6,586,830 B2
(45) Date of Patent: Jul. 1, 2003

(54) SEMICONDUCTOR DEVICE WITH AN INTERPOSER

(75) Inventor: Takashi Saito, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/860,042

(22) Filed: May 17, 2001

(65) Prior Publication Data

US 2002/0011657 A1 Jan. 31, 2002

(30) Foreign Application Priority Data

May 19, 2000 (JP) .................................... 2000-147836

(51) Int. Cl.[7] ...................... H01L 23/485; H01L 23/48
(52) U.S. Cl. .................. 257/700; 257/692; 257/697; 257/773
(58) Field of Search ................. 257/692, 697, 257/700, 738, 773

(56) References Cited

U.S. PATENT DOCUMENTS 4,698,663 A * 10/1987 Sugimoto et al. ......... 174/16.3
5,486,723 A * 1/1996 Ma et al. .................. 257/697
5,513,076 A * 4/1996 Werther .................... 257/697

FOREIGN PATENT DOCUMENTS

JP         2000-392843 A  *  5/2000   ........... H01L/21/60

* cited by examiner

*Primary Examiner*—Allan R. Wilson
(74) *Attorney, Agent, or Firm*—Robert J. Depke; Holland & Knight LLC

(57) ABSTRACT

An improved semiconductor chip interconnection advantageously employs a thin conductive layer that is used to form conductive members located between two nonconductive layers. The upper nonconductive layer has openings formed therein through which electrical connections are made between contacts in the chip member and the conductive members. The conductive members preferably have portions which are substantially parallel to a bottom surface of the semiconductor chip located between nonconductive layers and an upper nonconductive layer has openings formed therein through which electrical connections are made with the semiconductor chip. The conductive members have portions that extend downward away from the bottom surface of the chip.

11 Claims, 17 Drawing Sheets

SEMICONDUCTOR DEVICE WITH AN INTERPOSER

RELATED APPLICATION DATA

The present application claims priority to Japanese Application No. P2000-147836 filed May 19, 2000, which application is incorporated herein by reference to the extent permitted by law.

BACKGROUND OF THE INVENTION

The present invention relates to a semiconductor device, an interposer thereof, and a method of manufacturing the same, and in particular, the present a invention relates to a semiconductor device having a CSP (Chip Size Package or Chip Scale Package) structure, an interposer thereof, and a method of manufacturing the same.

In order to cope with a demand for a compact design of recent electronic products, necessity of a high density packaging for electronic parts, in particular, for semiconductor devices is increasing. Therefore, a CSP (Chip Size Package) is adopted as one of such high density packages instead of a conventional plastic package.

An internal structure of the CSP can be divided roughly into two types depending on a method of interconnection between electrodes of an IC (Integrated Circuit) chip (which may be referred to also as a chip or a semiconductor chip hereinafter) and an interposer (wiring board). One of two types of the CSP is a wire bonding type CSP as indicated in FIG. 16, wherein after connecting an interposer 21A and electrodes of an IC chip 10 to each other with a copper wire 17, they are packaged with a resin 18 to form a semiconductor package 20, which is then connected to a mounting substrate via a solder bump 11.

The other type is a flip-chip type CSP as indicated in FIG. 17, wherein an IC chip 10 and an electrode 23 of an interposer 21 are connected to each other via a solder bump 22, and an under-fill material is filled in a gap between the IC chip 10 and the interposer 21 to form a package 25, which is then connected to a mounting substrate via a solder bump 11.

Although the wire bonding type CSP will provide a cheaper package, there is, however, such a disadvantage that the package size becomes larger than its chip size because of a necessity of an additional space for accommodating its wiring. On the other hand, the flip-chip type CSP has such an advantage that the package size can be reduced. Therefore, in order to cope with an increasing demand for compact design of recent electronic products, the flip-chip type packaging is increasing.

Further, as for a structure of external electrodes of the CSP, there are two types. One of them is shown in FIG. 18, which has a ball grid array type structure provided as a package's lower surface electrode which functions as external electrodes of the CSP. The other one shown in FIG. 19 has a land grid array type structure which is comprised only of electrodes 24 of the interposer 21A without using the solder ball.

Interconnection between the semiconductor package and a mounting substrate (which may be referred to also as a substrate hereinafter) in both cases of the above is carried out by a solder bonding technique in which the solder on the substrate is fused in an oven, then solidified. FIG. 20 shows a state of a module after packaging.

As for a reliability of a semiconductor package manufactured as described above, in particular, in its heat cycle test, while in consideration that a cause of most of failures is due to a difference of linear expansion coefficient between the semiconductor chip and the mounting substrate (a linear expansion coefficient of the semiconductor chip: 3 to 4 ppm/a linear expansion coefficient of the mounting substrate: 15 to 20 ppm), however, because the semiconductor package has a sandwich structure with the interposer 21 interposed between the semiconductor chip 10 and the mounting substrate 13 thereby spacing apart both of them at a distance, and thereby attempting to relieve or absorb a stress or strain due to thermal expansion and contraction of the semiconductor chip 10 and the mounting substrate 13.

However, because of an increasing number of terminal pins needed for a large scale integration of a semiconductor integrated circuit, miniaturization in the size of solder balls for interconnection between the semiconductor package (CSP) and the mounting substrate is advancing, and now, a size of solder balls smaller than 300 $\mu$m in comparison with a conventional size of 800 $\mu$m is emerging. In addition, a size of the package is also being large-scaled. Therefore, it is becoming very difficult to guarantee a package reliability for the package module which has the above-mentioned CSP mounted on the mounting substrate in the conventional manner described above.

More specifically, in an accelerated heat cycle testing for determining the package reliability, it is becoming more difficult for the conventional interposer 21 to be able to relax the stress due to the thermal expansion and contraction. Namely, because of a relatively large difference in linear expansion coefficients between the IC chip 10 and the mounting substrate 13, the IC chip 10 and the interposer 21 cannot follow a large contraction of the mounting substrate 13 at the time of its contraction after expansion, thereby allowing the mounting substrate 13 having a large degree of expansion and contraction to warp at its non-contacting portion at the time of contraction, and thereby damaging the solder for interconnection. Therefore, as a result, a failure mode such as ruptures of inner bumps A as shown in FIG. 21 and secondary connection solder bumps B as shown in FIG. 21 is likely to occur.

SUMMARY OF THE INVENTION

An object of the present invention is to solve the above-mentioned problems associated with the conventional art, and to provide a semiconductor device and its interposer having a semiconductor package structure capable of realizing an improved package reliability, and a method of manufacturing the same.

That is to say, the present invention is directed to a provision of a semiconductor device having a structure in which an external terminal or a conductive part (It may be a thin electrode) connected thereto is interposed, with a predetermined length (for example, 100 to 300 $\mu$m) thereof being exposed, in a gap between a semiconductor chip and a mounting substrate for mounting the semiconductor chip thereon.

In the semiconductor device according to the invention, the external terminal or the conductive part connected thereto which is interposed, with the predetermined length thereof being exposed, in the gap between the semiconductor chip and the mounting substrate is allowed to deform in response to a differential expansion coefficient between the semiconductor chip and the mounting substrate due to a thermal stress at the time of packaging of the semiconductor chip and/or in use after packaging, and therefore, this deformation allows to absorb a mechanical stress at the time of cooling caused by a difference in contraction between the semiconductor chip and the mounting substrate having a different expansion coefficient to each other. As a result, a highly reliable interconnection at each portion between the semiconductor chip and the mounting substrate is ensured to be maintained, thereby providing a semiconductor device featuring a very high package reliability.

Further, the present invention is directed to a provision of a method of manufacturing the semiconductor device, the method comprises the steps of: interposing an external terminal or a conductive part (It may be a thin electrode) to be connected to the external terminal, with a predetermined length thereof being exposed, in a gap between a semiconductor chip and a mounting substrate for mounting the same; and coating the other portion of the external terminal excepting the exposed portion having the predetermined length with a conductive material.

According to the method of manufacturing the semiconductor device of the invention, wherein a same semiconductor device as the semiconductor device of the invention described above can be fabricated, there can provided a method of manufacturing the semiconductor device having the same function and advantages embodying the invention with an improved reproducibility.

Further, the present invention is directed to a provision of an interposer to be interposed in a gap between a semiconductor chip and a mounting substrate for mounting the semiconductor chip, wherein its external terminal of the interposer is arranged to intervene between the interposer and the mounting substrate, with a predetermined length thereof being exposed.

According to the interposer of the invention, because its external terminal has a same structure as that of the semiconductor device of the invention described above, if a semiconductor chip is mounted on a substrate via this interposer, the same function as that of the semiconductor device of the invention described above can be attained.

Furthermore, the present invention concerns with a method of manufacturing the interposer which is interposed in the gap between the semiconductor chip and the mounting substrate to mount the chip, and which has the external terminal or the conductive part to be connected thereto, with a predetermined length thereof being exposed.

According to the method of manufacturing the interposer of the invention, whereby a same interposer as that of the invention described above can be fabricated, there can be provided the method of fabricating interposers which are capable of realizing the same function as that of the invention with an improved reproducibility.

BRIEF DESCRIPTION OF THE DRAWINGS

In the accompanying drawings:

FIGS. 2A to 2B are diagrams illustrating a deformation of external terminals due to thermal stresses applied to the CSP, wherein FIG. 2A depicts a normal state while FIG. 2B depicts a deformed state thereof;

FIGS. 3A to 3C show a fan-in type interposer, wherein FIG. 3A shows a bottom surface thereof, FIG. 3B shows a cross-section thereof, and FIG. 3C shows a cross-section in detail of a portion cut along a line IIIC—IIIC in FIG. 3A;

FIGS. 4A to 4B show an enlarged diagram of FIG. 3C, wherein FIG. 4A shows its initial state prior to bending, and FIG. 4B shows its state after bending;

FIGS. 6A to 6B illustrate a fan-in/out type interposer embodying the invention, wherein FIG. 6A shows a bottom surface thereof, and FIG. 6B shows a cross-section thereof;

PREFERRED EMBODIMENTS OF THE INVENTION

Referring now to the accompanying drawings, preferred embodiments of the invention will be described in the following.

Figure 1:
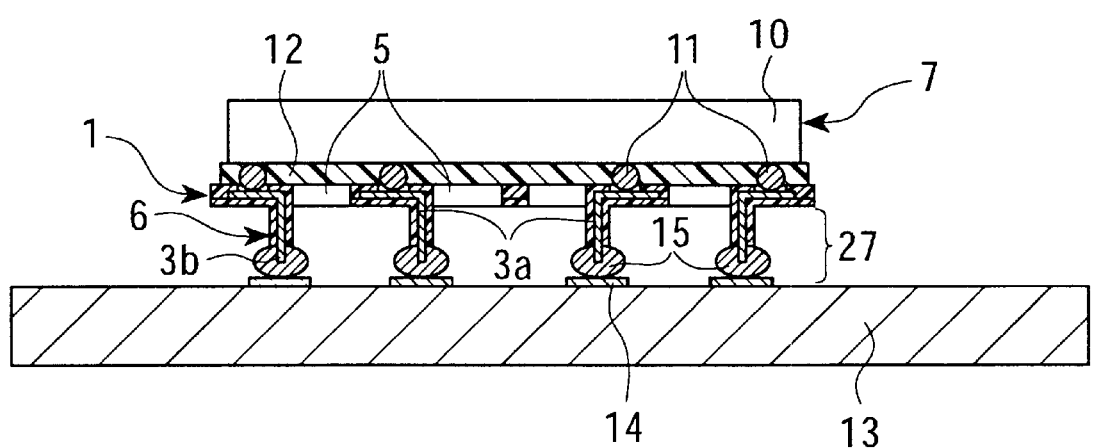
FIG. 1 is a schematic diagram illustrating a state of packaging of a CSP mounted on a mounting substrate according to one embodiment of the invention.

In the semiconductor device, the interposer thereof, and the method of manufacturing the same according to the invention described above, an external electrode 6 preferably projects from a semiconductor package 7 for constituting a semiconductor chip size package as indicated in FIG. 1.

Further, the above-mentioned external terminal may be allowed to bend from its non-projecting state downwardly as shown, for example, in FIG. 15.

Figure 10:
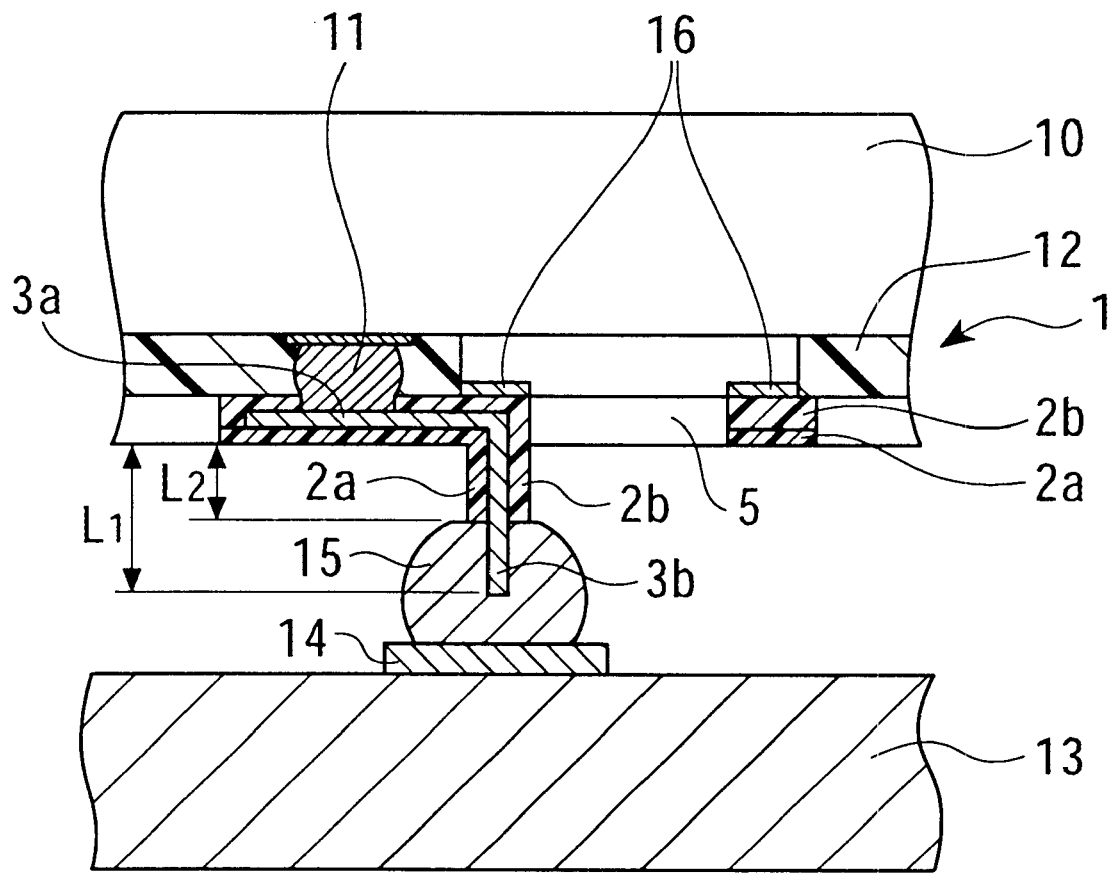
FIG. 10 shows an enlarged portion of section A in FIG. 9.

Still further, preferably, the above-mentioned semiconductor package 7 is comprised of the semiconductor chip 10 and an interposer 1 connected thereto, wherein the interposer 1 has a lamination structure of a resin layer such as polyimide and a wiring pattern made of such as copper, an electrode of the semiconductor chip 10 is connected to an electrode of the interposer 1, a predetermined portion of the interposer 1 has an aperture, and from this aperture one end of a respective wiring portion of a wiring pattern 3a is bent to form an external electrode 6 (with a length L1, for example, of 100 to 300 μm with reference to FIG. 10 to be described later) projecting out of the plane of the interposer 1. Although the shorter the length of the external electrode 6, the narrower the pitch between respective external terminals becomes smaller thereby ensuring a higher wiring density to be realized, however, if it becomes too short, it becomes difficult to absorb the mechanical stress, on the other hand, if it becomes too long, the pitch between respective terminals cannot be reduced. Therefore, a length of the external electrode 6 is preferably in a range of 100 to 300 μm, which allows easily to form an appropriate length of exposure (L2 in FIG. 2 to be described later).

Then, preferably, the one end, which is bent, of respective wiring pattern 3a is connected to a wiring pattern of the mounting substrate via a conductive material 15.

In this instance, preferably, an oil repellent 16 is coated at least on a portion in the periphery of the aperture 5 as shown in FIG. 10. Thereby, an under-fill material to be filled in a gap between the semiconductor chip and the interposer can be prevented from intruding into the aperture. However, it is not always necessary to coat with the oil repellent, and the aperture may be filled with the under-fill material thereby reinforcing the strength of the external terminal.

With reference to FIGS. 7 and 8, the semiconductor device according to the invention is preferably fabricated by the method which comprises the steps of: forming a wiring pattern 3a on a first resin layer 2a as shown in FIGS. 7 and 8; forming the interposer 1 having a lamination structure by laminating a second resin layer 2b on the wiring pattern; forming the aperture 5 by removing a predetermined portion of the interposer; bending one end of a respective portion of the wiring pattern protruding as exposed in the aperture from one side of the aperture 5 to an opposing side so as to project out of a plane of the interposer; connecting the semiconductor chip 10 to the wiring pattern 3a of the interposer 1, for example, via solder; and filling the under-fill material 12 made of a resin or the like into a gap therebetween. Thereby, the semiconductor device such as the CSP having its external terminal of the wiring pattern bending outwardly is provided, prior to its mounting on a mounting substrate.

Still further, the semiconductor device of the invention can be fabricated also by the following method, which comprises the steps of: forming a wiring pattern 3a on a first resin layer 2a as shown in FIGS. 7 and 8; forming an interposer 1 having a lamination structure by laminating a second resin layer 2b on the wiring pattern 3a; forming an aperture 5 by removing a predetermined portion in the interposer; connecting a semiconductor chip 10 to the wiring pattern 3a of the interposer 1, then filling the under-fill material 12 into a gap therebetween; and bending a portion of the wiring pattern which protrudes as exposed in the aperture from one side of the aperture 5 to an opposing side and in a downward direction thereof. Thereby, the external terminal of the interposer can be bent in the downward direction as described above from its non-projecting state at the time of mounting of the semiconductor device on the mounting substrate.

Furthermore, an interposer for use of a semiconductor device when mounting the semiconductor device on a mounting substrate can be fabricated also by the following method embodying the invention, which comprises the steps of: forming a wiring pattern 3a on a first resin layer 2a; laminating a second resin layer 2b on the wiring pattern; forming an aperture 5 by removing a predetermined portion; and bending one end of a respective portion of the wiring pattern 3a protruding as exposed in the aperture from one side of the aperture to an opposing side thereof and in a downward direction.

By way of example, the interconnection between the above-mentioned semiconductor chip and the interposer is not limited to the soldering connection, and any other connecting processes may be used such as an ACF connection process whereby Au stud bumps are formed on the side of the semiconductor chip and an anisotropic conductive film (ACF) is bonded thereto for interconnection.

Here, the "a predetermined length of exposure" of the external terminal is intended to mean a length of a portion of the external terminal that is not covered with the conductive material such as solder or the like (refer to "L2" in FIG. 10), thereby expressing a concept that the same includes a functional length which allows a deformation or an elastic deformation thereof relative to the mounting substrate under a thermal stress.

Preferred embodiments of the invention will be described more specifically in the following.

With reference to FIG. 1, in a CSP (Chip Size Package or Chip Scale Package) 7 embodying the invention, its external electrode 6 which is a portion of a copper wiring surrounded by polyimide in an interposer 1 is bent so as to project in one direction perpendicular relative to a plane of the interposer 1, with one end 3b of the external electrode 6 of a wiring pattern 3a being exposed, thereby providing an optimum structure for the CSP 7 embodying the invention. Then, this exposed portion 3b of the external electrode 6 is electrically connected to a mounting substrate 13 via a solder bump 15.

Therefore, because of the provision of the external electrode 6 (hereinafter, referred to also as the lower electrode, and is made of a thin metal wire) of the CSP 7 interposed in a gap between the CSP 7 and the mounting substrate 13 with its predetermined length exposed, a stress of deformation due to a differential thermal expansion coefficient between the CSP 7 and the mounting substrate 13 can be absorbed by this exposed external electrode 6, thereby preventing an occurrence of breakage in an interconnection between the mounting substrate 13 and the CSP 7.

Figure 2A:
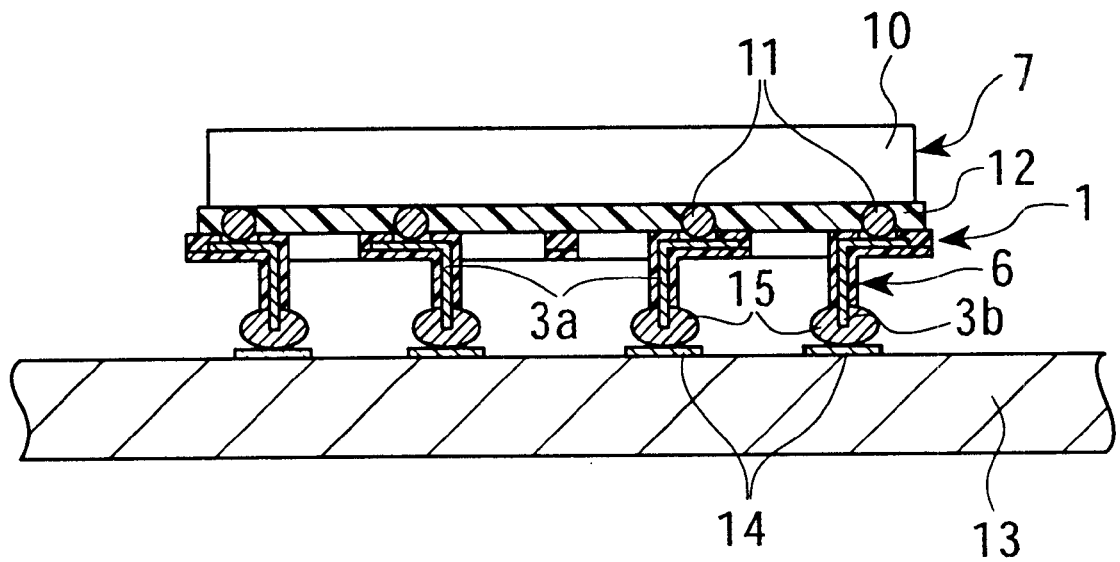

That is to say, in a normal state of the CSP 7 mounted on the mounting substrate 13 as shown in FIG. 2A, the external electrode 6 of the CSP 7 projects in a direction perpendicular relative to a plane of the CSP 7. However, there will occur various thermal and mechanical stresses on the solder bump 11 interconnecting between the semiconductor chip 10 and the interposer 1, and on the solder bump 15 interconnecting between the CSP 7 and the mounting substrate 13.

Thereby, all of the semiconductor chip 10, the interposer 1 and the mounting substrate 13 are subjected repeatedly to a cycle of thermal expansion and a contraction due to heating and cooling while processing and in use. However, as already described above, a difference in quantities of deformation between the semiconductor chip 10 and the mounting substrate 13 due to the differential thermal expansion coefficients therebetween is advantageously absorbed by the external electrode 6 having the exposed length intervening between the CSP 7 and the mounting substrate 13.

Figure 2B:
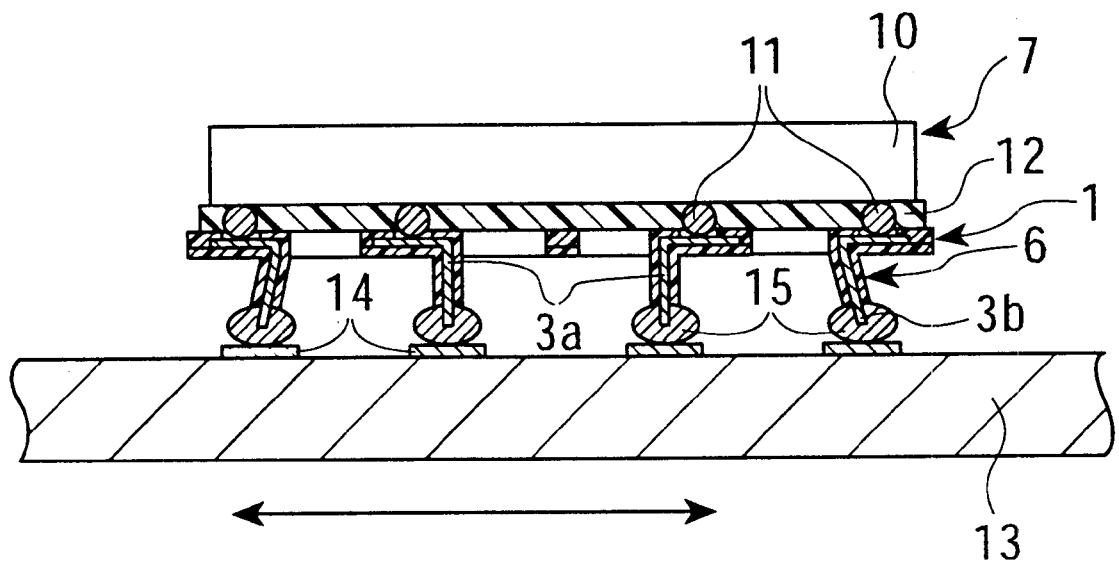

FIG. 2B shows a state thereof at the time of expansion. Namely, the external electrode 6 the one end of which is connected to the mounting substrate 13 having a large expansion coefficient deforms by expanding in a direction of an arrow in an expansion cycle, thereby allowing to absorb a differential deformation quantity between the chip 10 and the substrate 13, then gradually restores its initial form and returns to the normal state of FIG. 2A when cooled. Thereby, ensuring to prevent the breakage of the aforementioned interconnection portions.

Figure 3A:
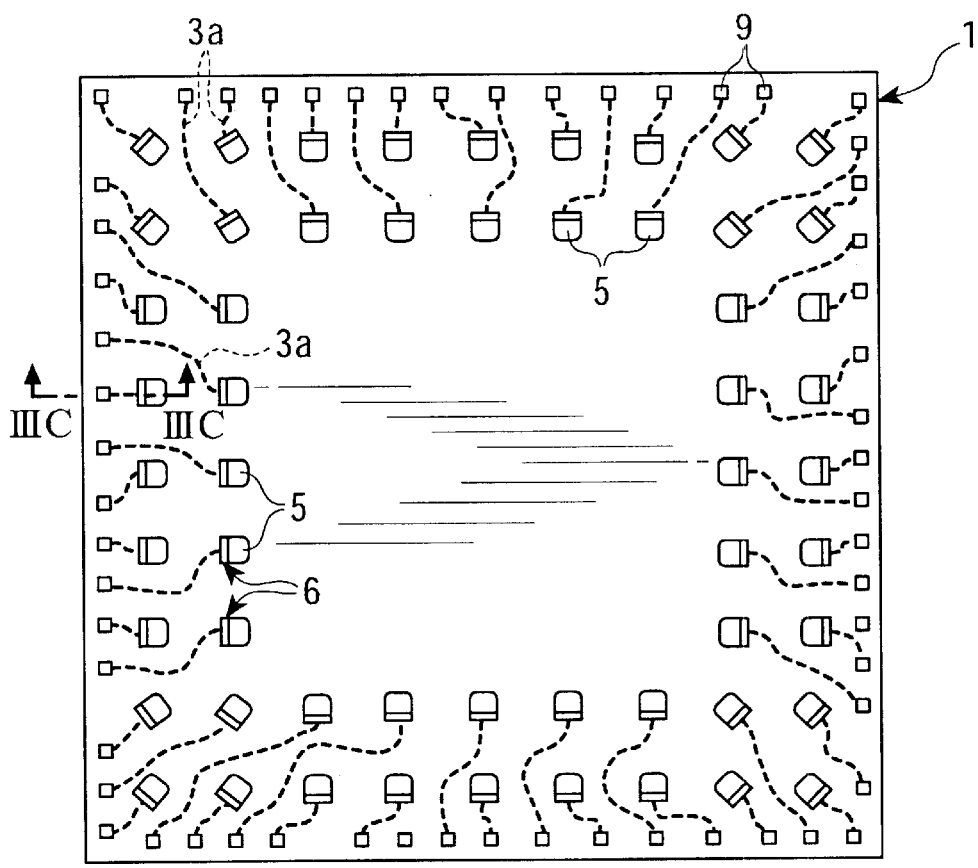
Figure 3B:
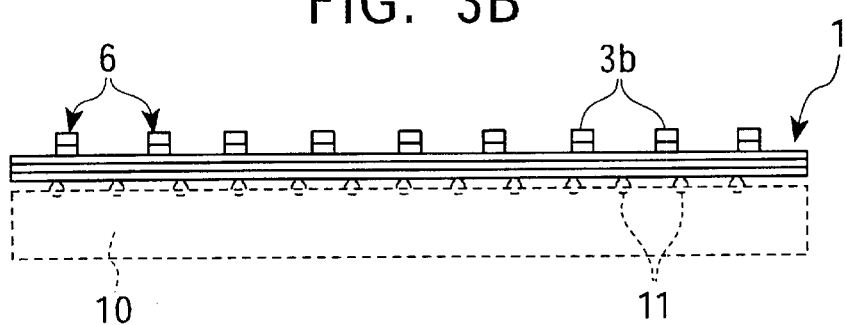
Figure 3C:
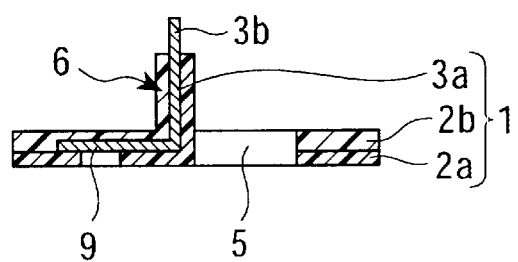

A suitable structure of the interposer 1 for use in the CSP embodying the invention will be described by way of example of a fan-in type structure as shown in FIGS. 3A to 3C. There are shown a fan-in type interposer 1, in which FIG. 3A shows a bottom surface (a surface facing the mounting substrate 13 in FIG. 1) of the interposer 1, thereby the semiconductor chip 10 is connected to a reverse surface opposite to this bottom surface as depicted in FIG. 3B with an imaginary line. FIG. 3B shows its state of connection. A plurality of connecting electrodes 9 are formed in a peripheral portion of this interposer 1, and a plurality of lower electrodes 6 are formed at respective positions of respective apertures 5 which lie to the internal side of the connecting electrodes 9. FIG. 3C is a cross-sectional view of an enlarged portion cut along the line IIIC—IIIC in FIG. 3A, illustrating a state of this structure.

Namely, in FIG. 3C, the interposer 1 embodying the invention has a lamination structure of three layers including a polyimide film 2a, a wiring pattern 3a and another polyimide film 2b. In an upper surface of the interposer 1 (a surface to make contact with the semiconductor chip 10), there is formed a respective connecting electrode 9 at a respective position corresponding to a respective mating electrode of the semiconductor chip 10. The wiring pattern 3a is formed from the respective connecting electrode 9 to the position of the lower electrode 6.

Then, as shown in FIG. 3A, respective lower electrodes are enlarged to have a 0.5 to 0.8 mm pitch and rearranged for convenience of easier packaging. Thereby, advantageously, the very fine wiring pattern is enabled to be led out onto a region having a wide area in order to form the lower electrodes thereon, thereby simultaneously enabling to enhance an effectiveness of wiring interconnection, prevent a damage to the wiring, and improve the performance of the semiconductor device.

Figure 4A:
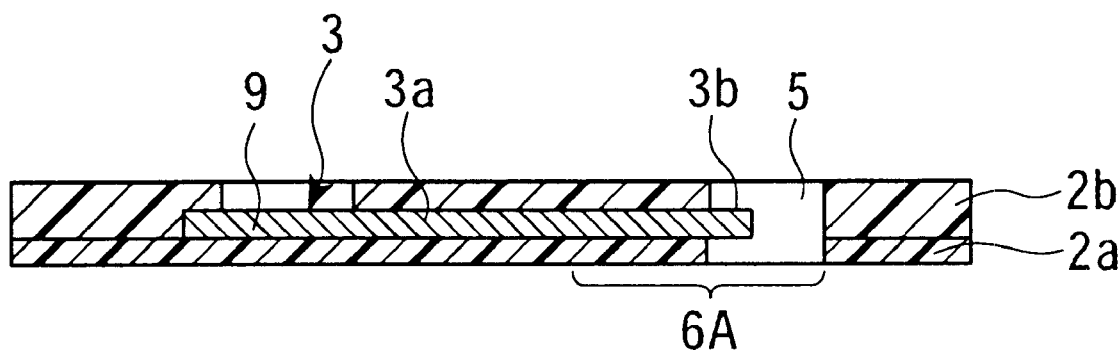
Figure 4B:
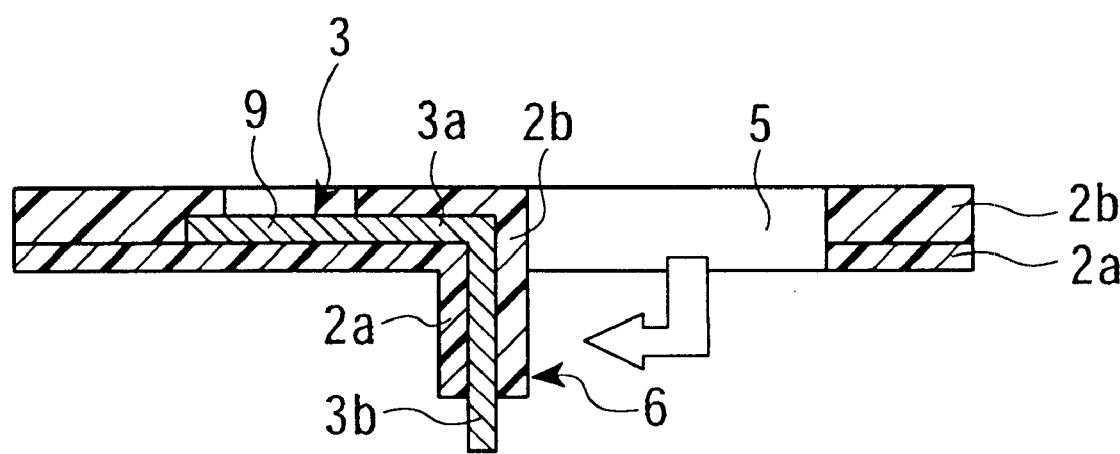
Figure 5:
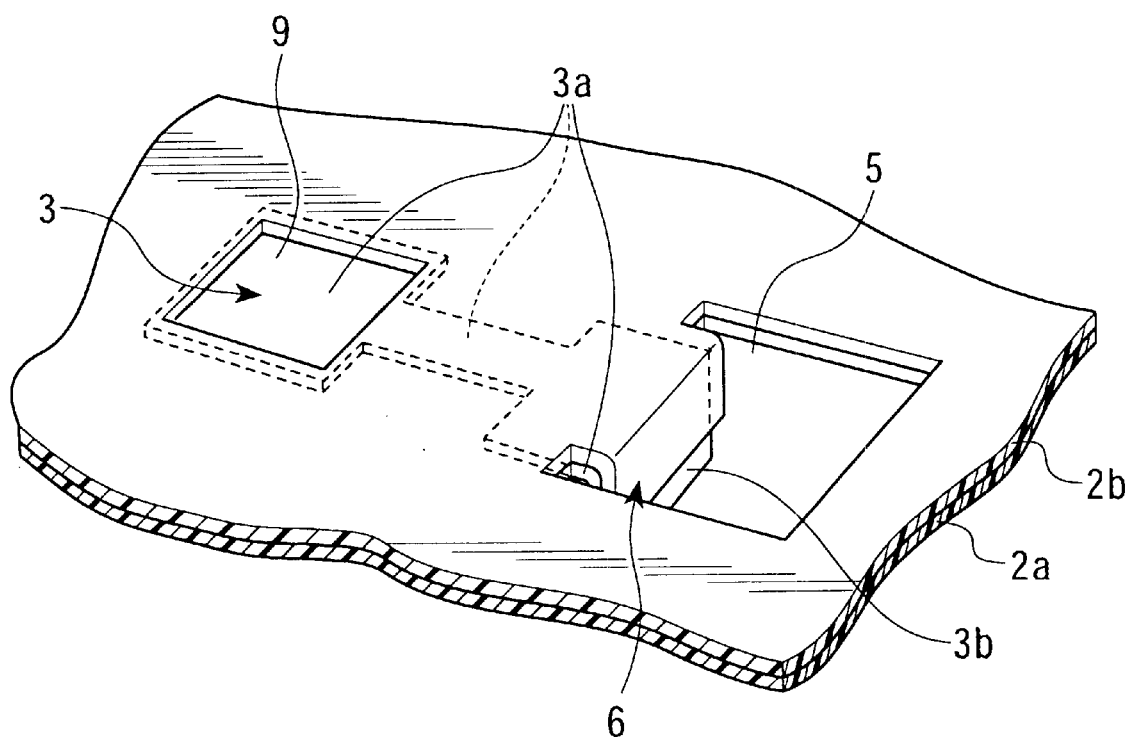
FIG. 5 is an enlarged perspective view of FIG. 4B.

FIGS. 4 and 5 show the lower electrode 6 further in detail. Namely, FIGS. 4A and 4B, which show the diagram of FIG. 3C as it is turned upside down and enlarged, illustrates a process of fabricating the lower electrode 6, while FIG. 5 is a perspective view of a portion in the vicinity of the lower electrode inclusive thereof.

As shown in FIGS. 4 and 5, an aperture 5 is preformed by etching in order to make it easier to bend a portion 6A of the wiring pattern 3a which is fabricated into a lead wire form, and which becomes the lower electrode 6. Then, in an end section of this portion 6A which is rearranged and becomes the lower electrode 6, an exposed portion 3b of the wiring pattern is provided, which is bent in advance with a punch prior to its connection to the semiconductor chip 10.

Figure 6A:
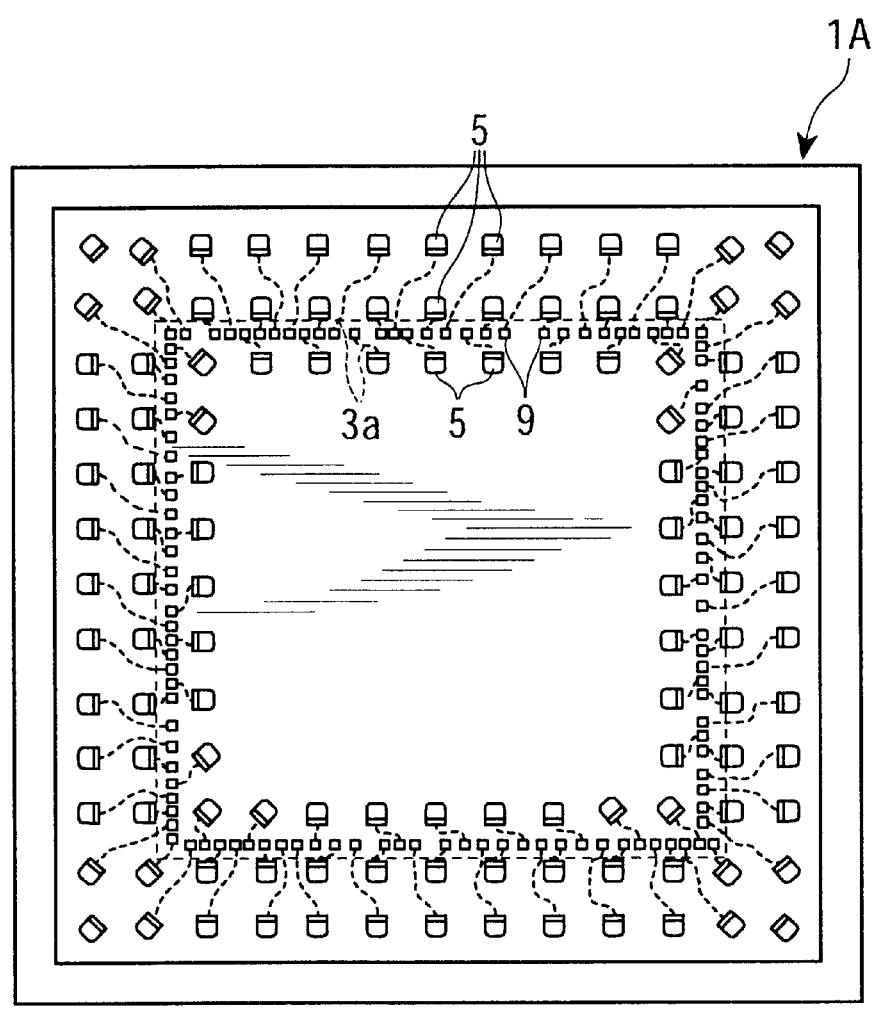
Figure 6B:
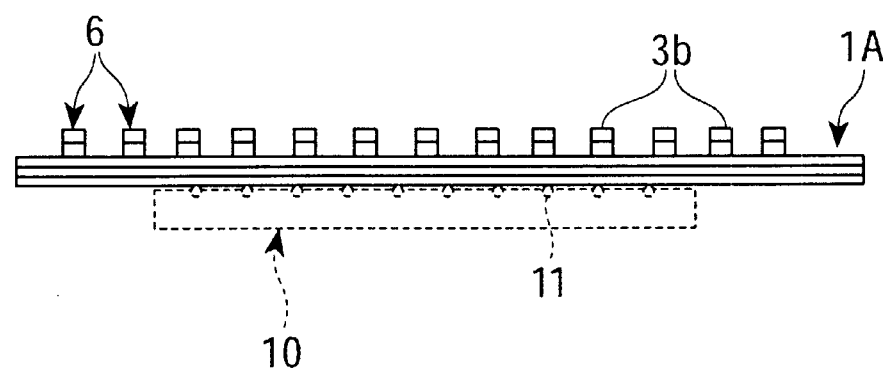

FIGS. 6A and 6B show an interposer 1A of a fan-in/out type. In a peripheral portion of this interposer 1A, a copper of the wiring layer 3 is disposed for reinforcement. This interposer 1A is different from the interposer 1 of the fan-in type described above in that its connecting electrodes 9 are disposed in an internal direction compared with those of the fan-in type, and that its lower electrodes 6 are disposed on both sides (inside and outside) along this connecting electrodes 9, though the structure of the lower electrode 6 is the same.

A method of fabricating the interposer 1 embodying the invention for fabricating the same in the manner described above, and a method of combining the same with an IC chip will be described in the following.

Figure 7A:
FIGS. 7A to 7E are diagrams illustrating steps of manufacturing the interposer embodying the invention.
Figure 7B:
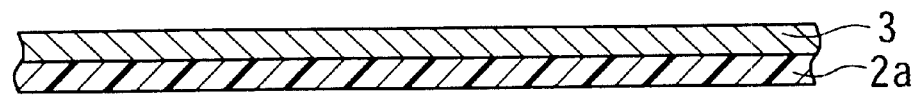
Figure 7C:
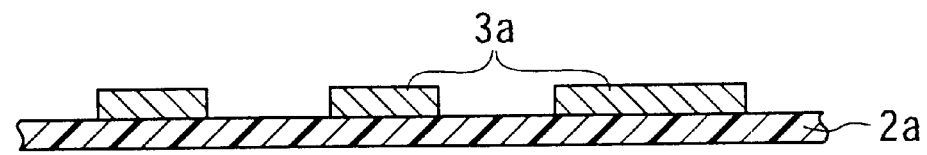
Figure 7D:
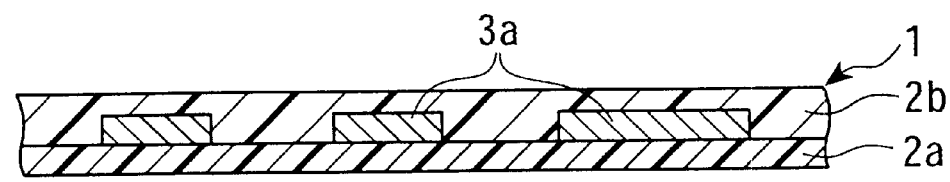
Figure 7E:
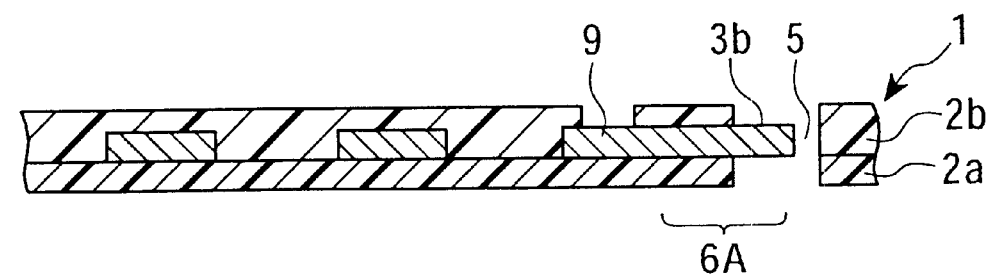

FIGS. 7A to 7E are schematic diagrams illustrating an outline of steps of fabricating the interposer 1 according to the invention. Namely, a first layer of polyimide film 2a is formed as shown in FIG. 7A, then a wiring layer 3 is formed thereon using copper as shown in FIG. 7B, followed by a step of patterning the wiring layer 3 so as to form a wiring pattern 3a as shown in FIG. 7C, then a second layer of polyimide film 2b is formed covering a whole area of an upper surface thereof as shown in FIG. 7D. Then, an electrode 9 for interconnection and an aperture 5 are formed by etching as shown in FIG. 7E. Then after forming an exposed portion 3b at one end of a bending portion 6A of the wiring pattern 3a, the bending portion 6A of the interposer 1 is bent in the perpendicular direction as already described with reference to FIG. 4 thereby providing the lower electrode 6.

FIGS. 8A to 8E show an outline of steps of combining the interposer fabricated as above and an IC chip.

Figure 8A:
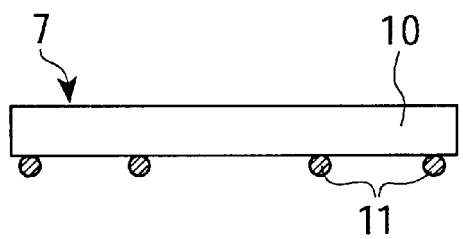
FIGS. 8A to 8E are diagrams illustrating steps of combining an IC chip and the interposer embodying the invention.

With reference to FIG. 8A, an electrode (normally, made of Al) of the semiconductor chip 10 is treated by electroless Ni plating, and solder bumps 11 are formed thereon in advance by plating or the like.

Figure 8B:
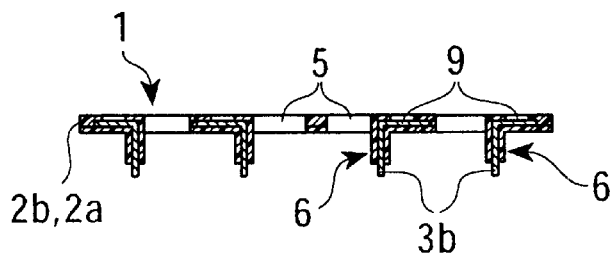
Figure 8C:
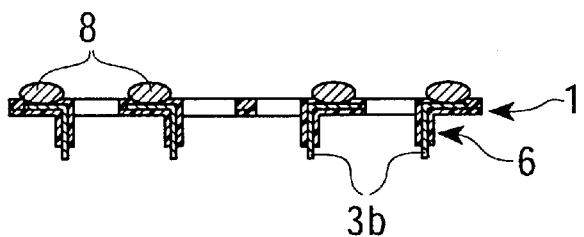

Then, solder 8 is pre-coated as shown in FIG. 8C on the connecting electrodes 9 shown in FIG. 8B which is formed in the interposer 1 as described above.

Figure 8D:
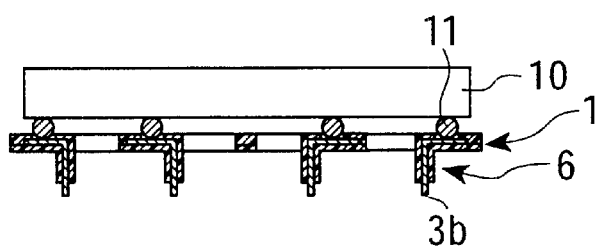

Then, as shown in FIG. 8D, the semiconductor chip 10 described above is mounted in a facedown mode on this interposer 1, and subjected to reflow-heating and solidification to make soldering connection.

Figure 8E:
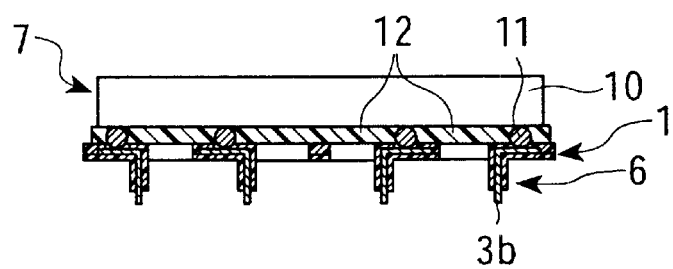

Subsequently, cleaning is performed to remove flux residues, then followed by the step of FIG. 8E, whereby an under-fill material (resin) 12 is filled in a gap between the semiconductor chip 10 and the interposer 1 to seal therebetween. At this time, in order to prevent for the under-fill material 12 to leak from the gap in the aperture 5, the oil repellent 16 is coated on a surface of the interposer in the periphery of the aperture 5 (refer to FIG. 10 and its description).

Figure 9:
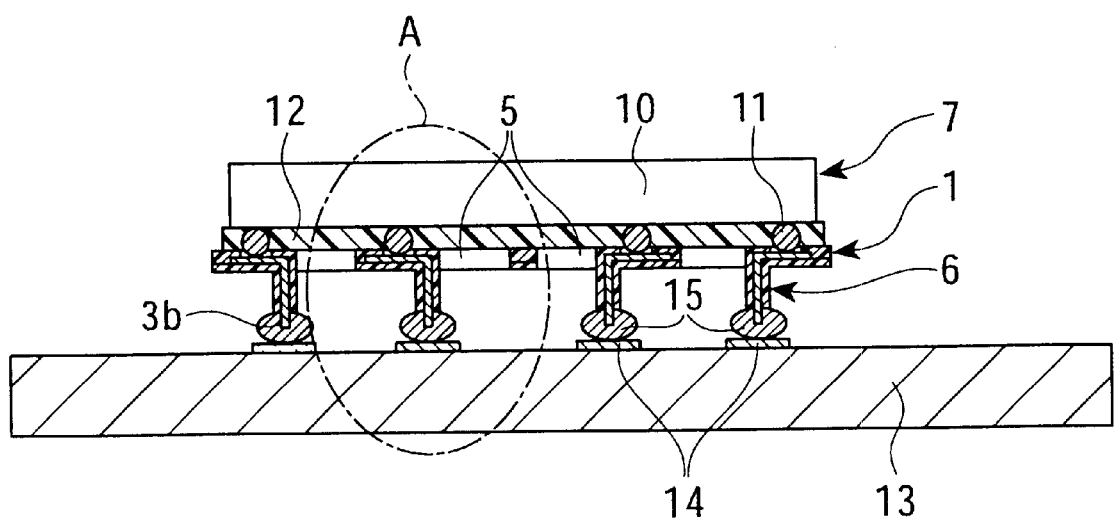
FIG. 9 shows a state of the CSP which is mounted on the mounting substrate according to the invention.

A state of the CSP 7 embodying the invention fabricated as above and mounted on the mounting substrate 13 is illustrated in FIG. 9. An enlarged portion of A in FIG. 9 is shown in FIG. 10. A solder 15 provided on the side of the mounting substrate 13 is allowed to wet only the exposed portion at the end of the lower electrode 6 below the CSP 7, and does not wet and attach to the other portion thereof which is covered with the polyimide. Therefore, the mounting substrate 13 and the CSP 7 are connected with each other via the lower electrode 6 which is covered with the polyimide layers 2a and 2b, and interposed there-between.

According to the present embodiment of the invention, because that the CSP 7 is comprised of the semiconductor chip 10 and the interposer 1 connecting thereto, wherein the interposer 1 has the three layered structure comprising the wiring pattern 3a made of copper, the upper and the lower polyimide layers 2a and 2b sandwiching the wiring pattern 3a, and that the portion at one end of the wiring pattern 3a is bent to intervene between the interposer and the mounting substrate, there are provided such advantages that various thermal and mechanical stresses on the connecting portions between the semiconductor chip 10 and the interposer 1 and/or between the interposer 1 and the mounting substrate 13 applied during the packaging process or in use thereafter can be absorbed or relieved by the bent and exposed portion 3a, thereby solving the above-mentioned problem associated with the prior art of the breakage of the interconnecting portions, and ensuring the highly reliable connection reliability to be attained.

Further, because that the CSP 7 and the mounting substrate 13 are interconnected via soldering connection, replacement of an IC device (CSP) having defects can be done easily. Thereby, if the interposer and the mounting substrate are fabricated to have a real chip size, because it allows a high density packaging exactly the same as that of the bear chip packaging, the problem of replacement of a failed bear chip associated with the prior art and have been difficult to solve conventionally can be solved by use of the CSP embodying the invention.

It should be noted that various modifications of the preferred embodiments of the invention described above can be contemplated within the scope of the present invention.

Figure 11:
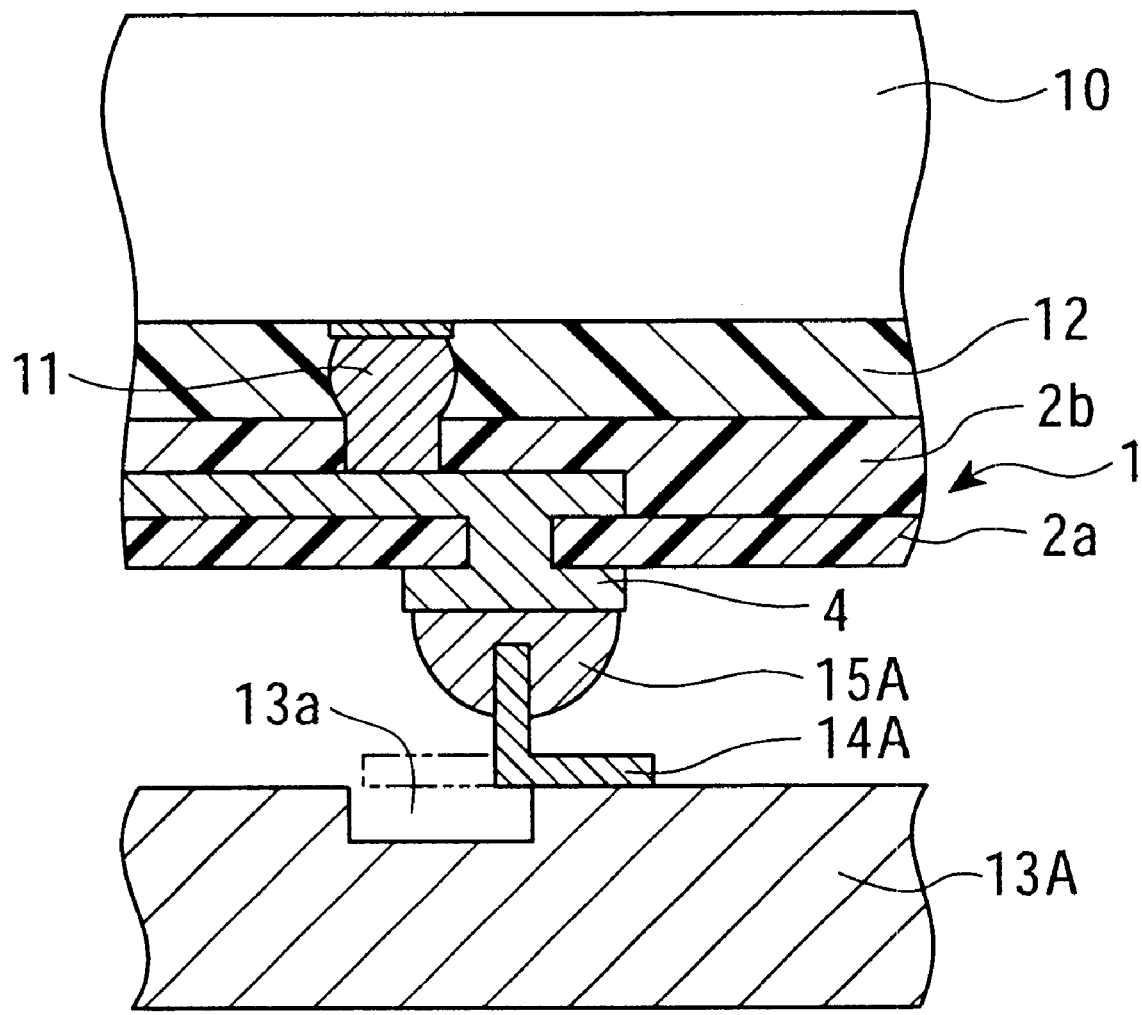
FIG. 11 shows an example of modifications embodying the invention.

For example, the external terminal of the invention can be fabricated into a different structure other than that described above. Namely, with reference to FIG. 11, at the time of etching a conductive layer in the mounting substrate 13A, a recess portion 13a is formed below the conductive layer, then a portion of the conductive layer above the recess portion is erected as a substrate electrode 14A, then this erected substrate electrode is connected to the wiring pattern 4 of the interposer via solder 15A.

Figure 12:
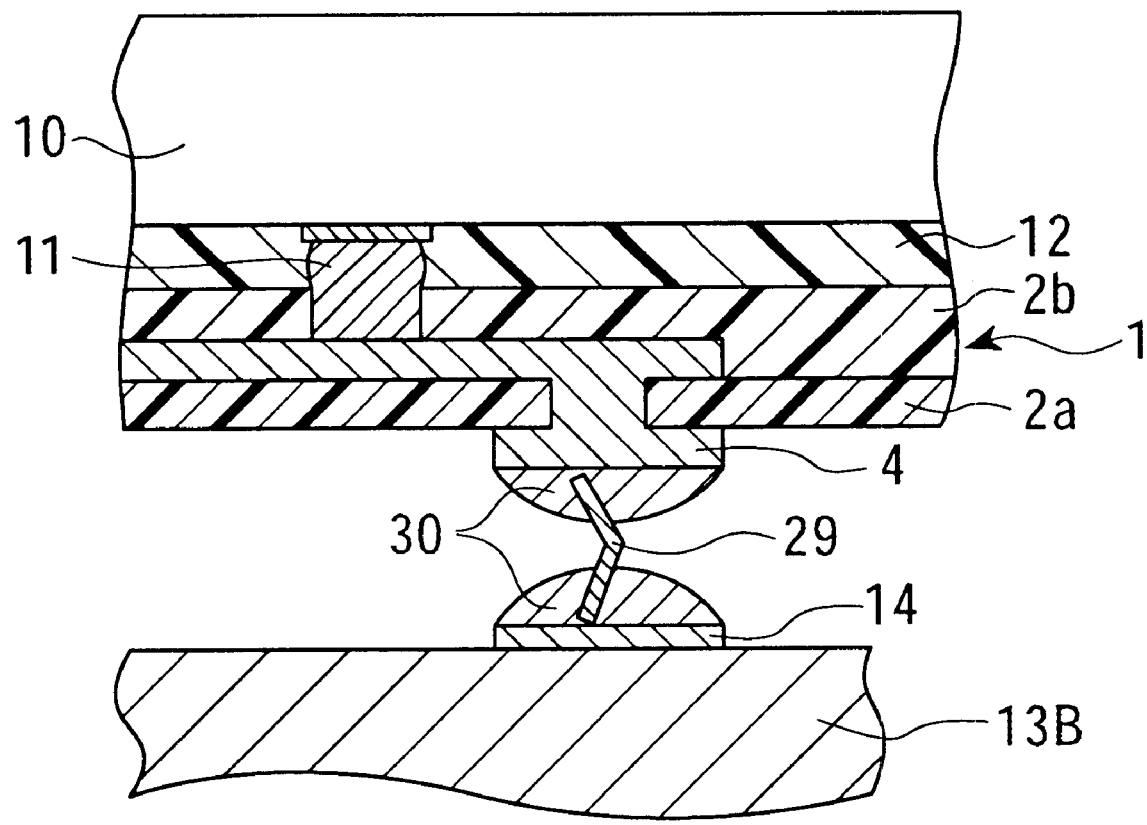
FIG. 12 shows another example of modifications embodying the invention.

Further, with reference to FIG. 12, it may be arranged also such that a conductive part 29 which is slightly bent is disposed between the wiring pattern 4 of the interposer 1 and the substrate electrode 14, and both ends of this conductive part 29 are connected to respective electrodes 4 and 14 of the above two via solder 30.

Figure 13:
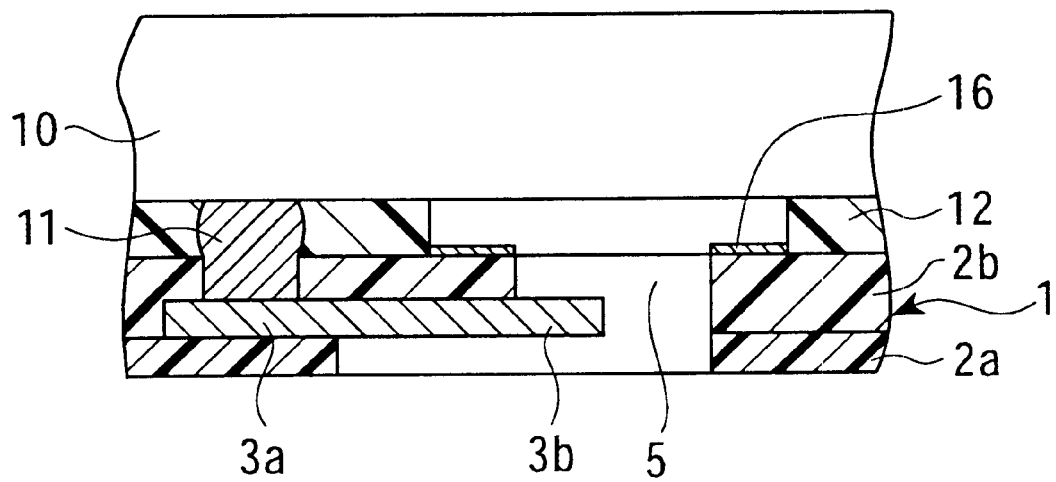
FIG. 13 shows still another example of modifications embodying the invention.

With reference to FIG. 13, it may be arranged also such that the exposed portion 3b of the wiring pattern 3a has a larger exposed area on its lower surface than that on its upper surface.

Figure 14:
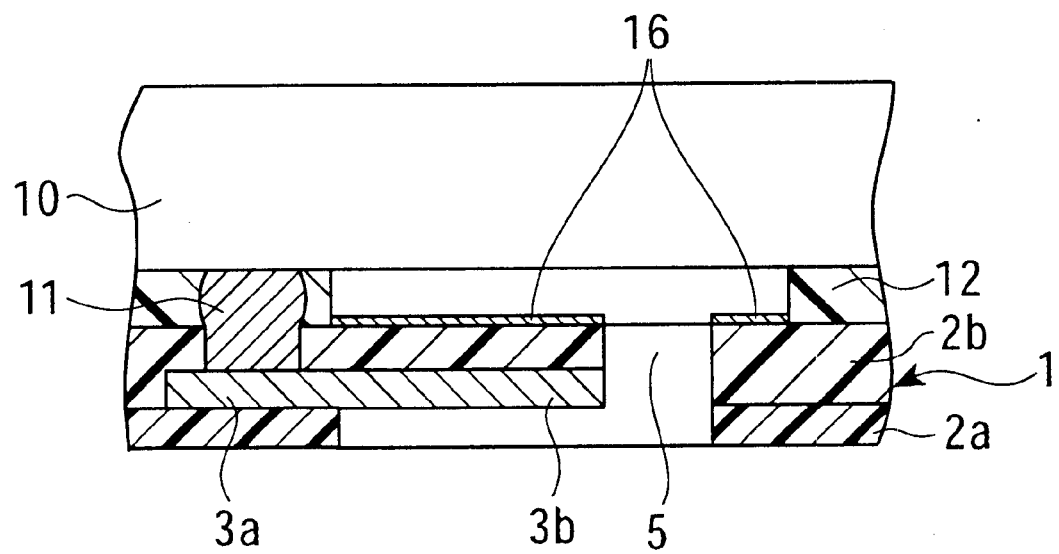
FIG. 14 shows still more example of modifications embodying the invention.
Figure 15A:
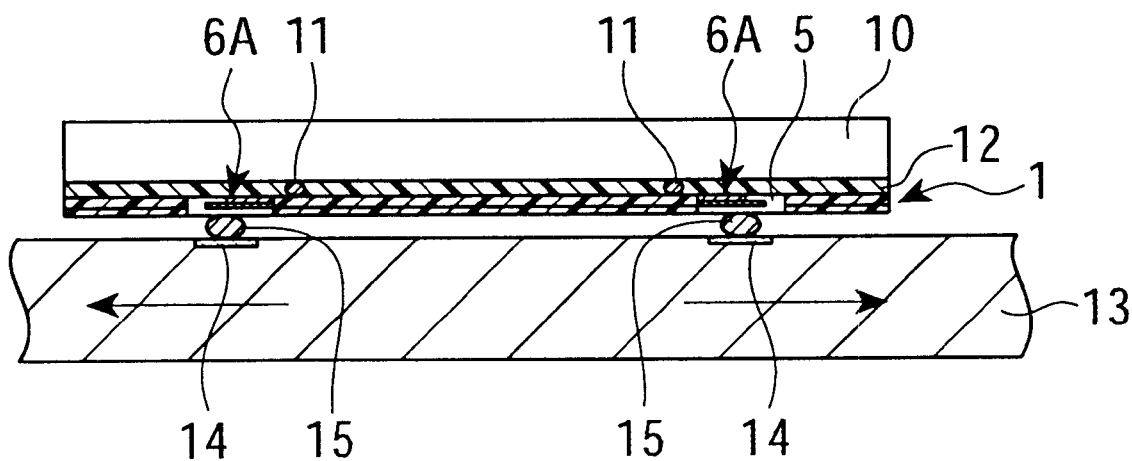
FIG. 15 shows still further example of modifications embodying the invention.
Figure 15B:
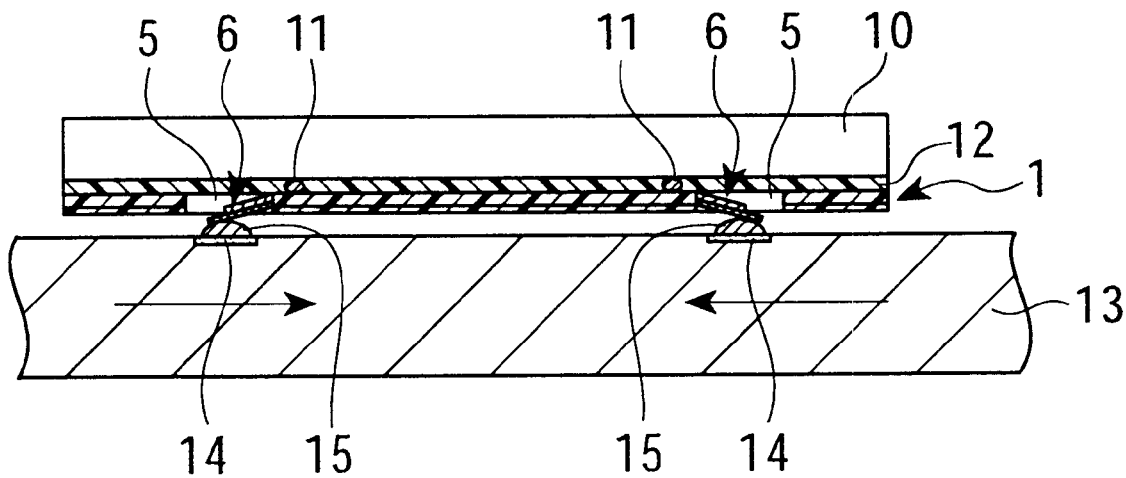

Further, with reference to FIG. 14, it may be arranged such that the exposed portion 3b of the wiring pattern 3a is formed only on the lower surface thereof. Thereby, without need of bending the portion 6A for the lower electrode 6 in advance as done in the embodiment described already, because of an increased surface area available for solder bonding, the portion 6A subject to bending which is connected to a substrate electrode 14 of the mounting substrate 13 via a solder 15 is allowed to bend freely and naturally in response to a contraction of the substrate 13 during a cooling cycle. FIGS. 15A to 15B illustrate such bending modes at the time of contraction, where FIG. 15A shows a state of mode in a heating cycle, and FIG. 15B shows a state of mode under contraction in a cooling cycle.

That is to say, in the heating cycle, the substrate 13 expands more in directions indicated by arrows, however, it contracts more in directions indicated by reverse arrows as shown in FIG. 15B. Therefore, the solder 15 for interconnection between the interposer 1 and the substrate 13 which is melted by heating and solidified by cooling, attaches to a wide area of the bottom surface of the bending portion 6A, thereby allowing for the lower electrode 6 to bend in the direction indicated by the arrow in FIG. 15B in response to contraction.

Further, the oil repellent 16 coated on the surface of the polyimide layer in the periphery of the aperture 5 for prevention of intrusion of the under-fill material 12 can be omitted. Thereby, because the aperture 5 is plugged with the under-fill material 12, a strength of the lower electrode 6 projecting can be reinforced.

Figure 16:
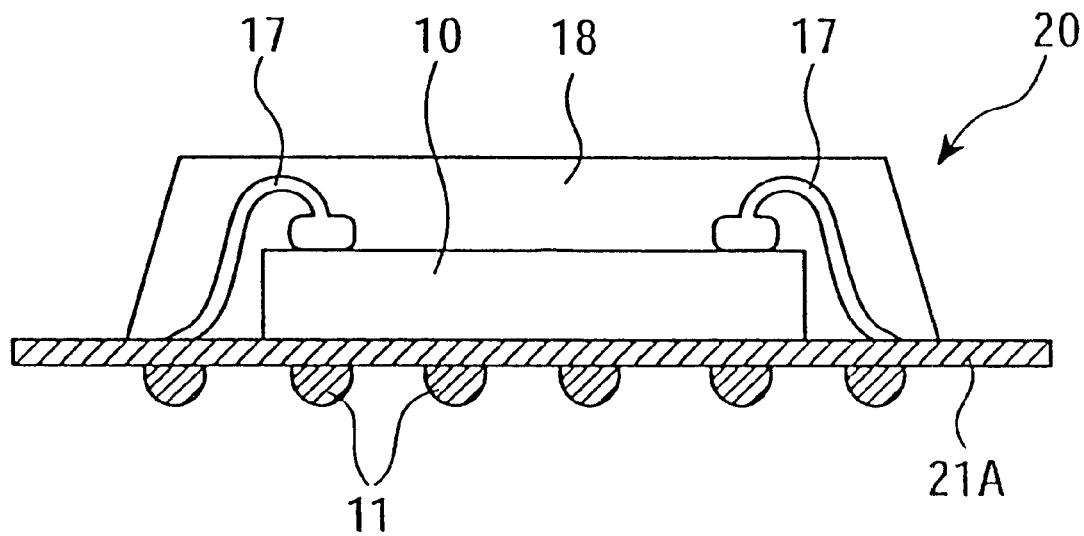
FIG. 16 is a diagram illustrating a conventional wire bonding type CSP.
Figure 17:
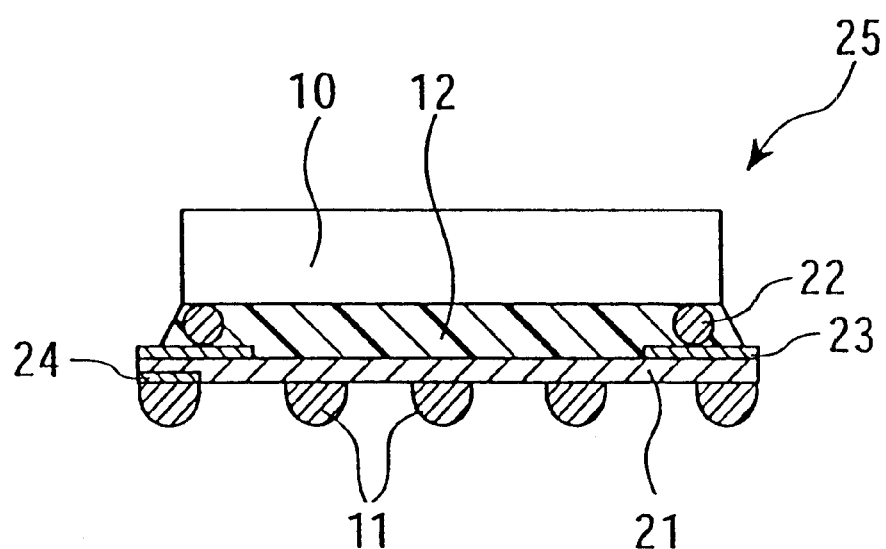
FIG. 17 is a diagram illustrating a conventional flip-chip type CSP.
Figure 18:
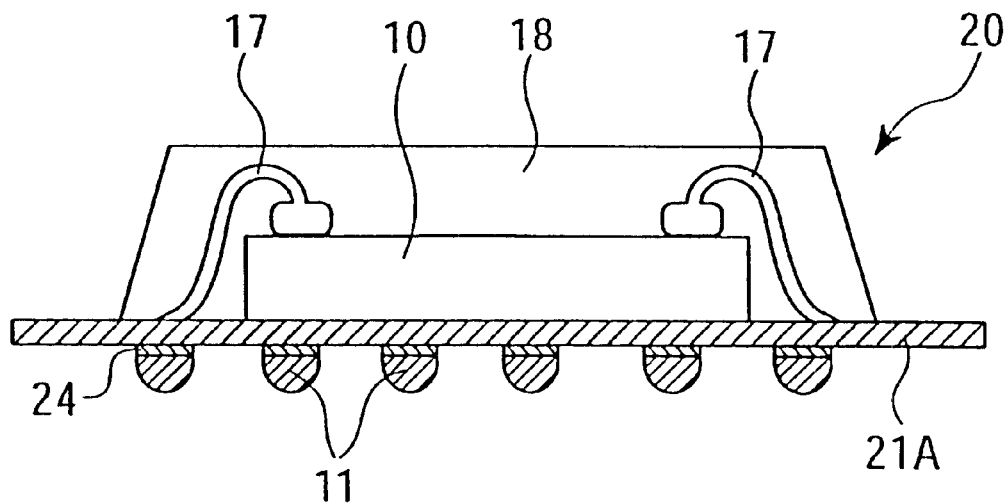
FIG. 18 is a diagram illustrating a conventional ball grid array type connecting method.
Figure 19:
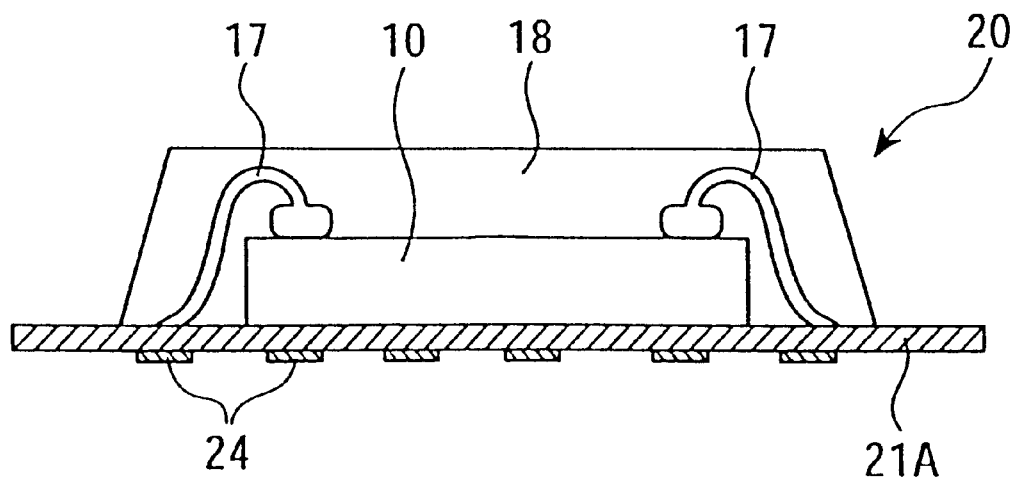
FIG. 19 is a diagram illustrating a conventional land grid array type connecting method.
Figure 20:
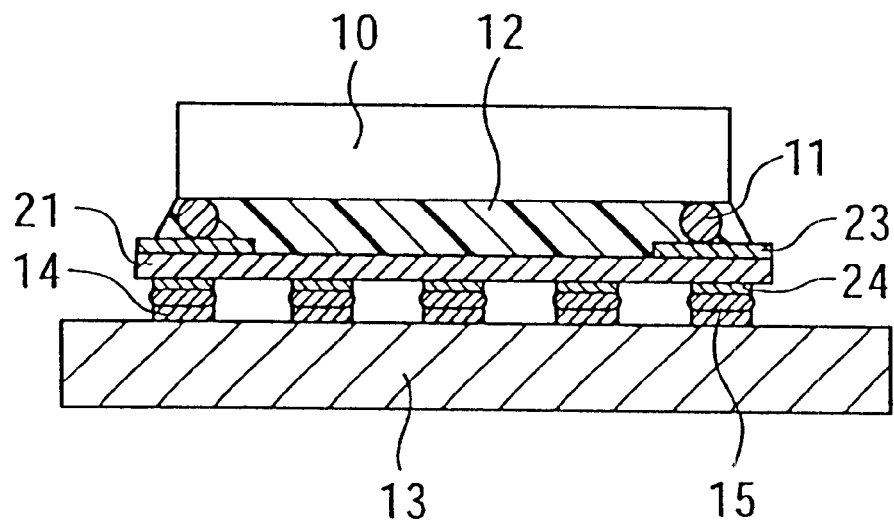
FIG. 20 is a diagram illustrating a state of packaging of a conventional flip-chip type CSP.
Figure 21:
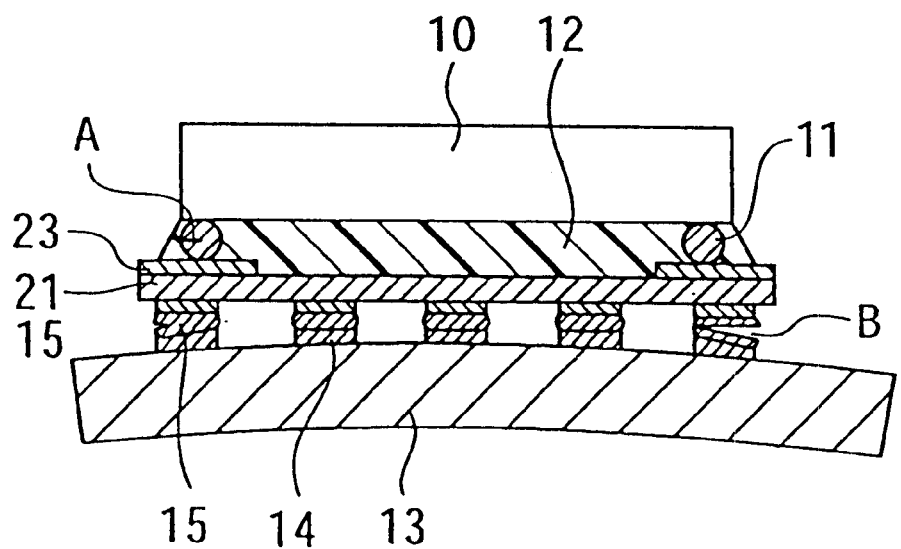
FIG. 21 is a diagram illustrating a state of breakage of a conventional flip chip type CSP due to a thermal stress after its packaging.

Still further, the interposer described hereinabove embodying the invention can be applied also to the conventional wire bonding type CSP which was already described with reference to FIG. 16.

Furthermore, the structures, forms, materials and the like of the interposer of the invention described above are not limited thereto, and many other modifications thereof can be contemplated within the scope of the invention.

Conclusively, according to the features of the semiconductor device and its interposer embodying the invention described hereinabove, because that the external terminal or the conductive part connected thereto is interposed in the gap between the semiconductor chip and the mounting substrate for mounting the semiconductor chip, and that the external terminal or the conductive part connected thereto is allowed to deform in response to a differential expansion coefficient between the semiconductor chip and the mounting substrate under thermal stresses at the time of packaging of the semiconductor chip or during its use after packaging, thereby the thermal or mechanical stress due to the difference in contraction therebetween in the cooling cycle resulting from their different expansion coefficients can be absorbed efficiently. As a result, the interconnection between the semiconductor chip and the mounting substrate is ensured to be maintained at respective portions thereof, thereby substantially improving the reliability of the package and its system.

What is claimed is:

1. A semiconductor device comprising:
   a semiconductor chip and
   an interposer attached to said semiconductor chip, wherein
      said interposer is comprised of
      thin conductive members having portions which are substantially parallel to a bottom surface of the semiconductor chip, the thin conductive members having portions located between nonconductive layers and an upper nonconductive layer has openings formed therein through which electrical connections are made with the semiconductor chip and the conductive members have portions that extend downward away from the bottom surface of the chip; and
      wherein the thin conductive members are continuous such that all portions are comprised of a same material.

2. The semiconductor device as claimed in claim 3, wherein;
   said interposer has a lamination structure of a resin layer and a wiring pattern; and
   electrodes of said semiconductor chip are connected to the conductive members.

3. An interposer to be affixed and connected to a semiconductor chip as to form a semiconductor package comprising:
   conductive members having portions which are substantially parallel to a surface of the interposer on which a semiconductor chip is secured and the conductive members have portions which are located between nonconductive layers and further wherein an upper nonconductive layer has openings formed therein through which electrical connections are made with the semiconductor chip and the conductive members have portions that extend downward away from a bottom of the interposer; and
   wherein the thin conductive members are continuous such that all portions are comprised of a same material.

4. The interposer as claimed in claim 3, wherein
   said portions of the conductive members that extend downward away from a bottom of the interposer are fabricated by bending the same in its non-projecting state so as to project out of said semiconductor package.

5. The interposer as claimed in claim 3, wherein
   said interposer has a lamination structure of a resin layer and a wiring pattern; and electrodes of said semiconductor chip are connected to the conductive members.

6. The interposer as claimed in claim 3, wherein the portions that extend downward away from a bottom of the interposer are coated with oil repellent on a top surface thereof.

7. A semiconductor mounting structure comprising:

a semiconductor chip;

an interposer formed to have a size similar to said semiconductor chip, wherein said interposer is mounted on said semiconductor chip as to form a semiconductor chip size package and said interposer has wiring electrodes for electrically connecting said semiconductor chip;

a mounting substrate having circuit pattern thereon; and wherein the interposer is comprised of conductive members having portions which are substantially parallel to a bottom surface of the semiconductor chip and the conductive members have portions located between nonconductive layers and an upper nonconductive layer has openings formed therein through which electrical connections are made with the semiconductor chip and the conductive members have portions that extend downward away from the bottom surface of the chip for making electrical connection with the circuit pattern of the mounting substrate; and wherein the thin conductive members are continuous such that all portions are comprised of a same material.

8. The semiconductor mounting structure as cited in claim 7, wherein said interposer has a plurality of first bump electrodes forming the electrical connections in the openings of the upper non-conductive layer; and said mounting substrate has a plurality of second bump electrodes connected to said circuit pattern.

9. The semiconductor device of claim 1, wherein the portions that extend downward are located between the non-conductive layers.

10. The interposer of claim 3, wherein the portions that extend downward are located between the non-conductive layers.

11. The semiconductor mounting structure of claim 7, wherein the portions that extend downward are located between the non-conductive layers.

* * * * *